(12) United States Patent
Lee

(10) Patent No.: US 9,392,687 B2
(45) Date of Patent: Jul. 12, 2016

(54) CIRCUIT BOARD

(71) Applicant: BOARDTEK ELECTRONICS CORPORATION, Taoyuan (TW)

(72) Inventor: Chien-Cheng Lee, Taoyuan (TW)

(73) Assignee: BOARDTEK ELECTRONICS CORPORATION, Taoyuan (TW)

( * ) Notice: Subject to any disclaimer, the term of this patent is extended or adjusted under 35 U.S.C. 154(b) by 0 days.

(21) Appl. No.: 14/946,764

(22) Filed: Nov. 19, 2015

(65) Prior Publication Data

US 2016/0150643 A1 May 26, 2016

(30) Foreign Application Priority Data

Nov. 21, 2014 (TW) .............................. 103220756 U

(51) Int. Cl.
*H05K 1/16* (2006.01)
*H05K 1/00* (2006.01)
*H05K 1/02* (2006.01)
*H05K 7/00* (2006.01)
*H05K 1/18* (2006.01)
*H05K 1/03* (2006.01)
*H05K 1/09* (2006.01)

(52) U.S. Cl.
CPC ............ *H05K 1/0306* (2013.01); *H05K 1/0296* (2013.01); *H05K 1/09* (2013.01); *H05K 1/183* (2013.01); *H05K 2201/068* (2013.01); *H05K 2201/09072* (2013.01)

(58) Field of Classification Search
CPC ................ H05K 1/0306; H05K 1/183; H05K 2201/068; H05K 2201/09072
USPC ........... 174/251, 258, 259, 260; 361/760, 761
See application file for complete search history.

(56) References Cited

U.S. PATENT DOCUMENTS

| 7,143,929 B2 * | 12/2006 | Furukuwa | H01L 23/3735 174/258 |
|---|---|---|---|
| 2011/0127076 A1 * | 6/2011 | Kim | H01L 24/24 174/258 |
| 2013/0003314 A1 * | 1/2013 | Igarashi | H05K 3/4608 361/719 |

* cited by examiner

*Primary Examiner* — Sherman Ng
(74) *Attorney, Agent, or Firm* — Li & Cai Intellectual Property (USA) Office

(57) ABSTRACT

A circuit board includes a multi-layer structure, a ceramic member, and a first conductive layer. The multi-layer structure has a thru-hole penetrating two opposite board surfaces thereof. The multi-layer structure includes a plurality of stacked plates and an adhesive connecting any two stacked plates. The ceramic member is arranged in the thru-hole of the multi-layer structure, and a surface of the ceramic member is approximately coplanar with a board surface of the multi-layer structure. The adhesive is adhered on the lateral surface of the ceramic member for connecting the ceramic member and the plates. The first conductive layer is formed on the board surface of the multi-layer structure and the surface of the ceramic member. Thus, the circuit board of the instant disclosure can be applied to a high-heat-generating product and is different from a conventional circuit board.

10 Claims, 9 Drawing Sheets

CIRCUIT BOARD

BACKGROUND OF THE INVENTION

1. Field of the Invention

The instant invention relates to a circuit board; in particular, to a circuit board having a ceramic member embedded therein.

2. Description of Related Art

Due to the application of high-heat-generating products (such as: high brightness LED) becoming more common, the thermal efficiency of circuit board needs to be increased. Thus, in recent years, a ceramic circuit board has been gradually applied on a high-heat-generating product, in order to meet the thermal efficiency of the high-heat-generating product.

However, the conventional ceramic board is formed by a ceramic plate and a conductive circuit disposed on the ceramic plate, and at least one high-heat-generating component is disposed on the conductive circuit. That is to say, the high-heat-generating component only uses part of the ceramic plate, but the other unused part of the ceramic plate causes an unnecessary waste of ceramic material.

SUMMARY OF THE INVENTION

The instant disclosure provides a circuit board having a ceramic member embedded therein for effectively improving the problem generated by the conventional circuit board.

The instant disclosure provides a circuit board, comprising: a multi-layer structure having a first board surface and an opposite second board surface, the multi-layer structure having a thru-hole penetrating the first board surface and the second board surface, wherein the multi-layer structure has a plurality of stacked plates and an adhesive connecting any two stacked plates; a ceramic member having a first surface, an opposite second surface, and a lateral surface connecting an edge of the first surface and an edge of the second surface, wherein the ceramic member is arranged in the thru-hole of the multi-layer structure, the first surface of the ceramic member is approximately coplanar with the first board surface of the multi-layer structure, the second surface of the ceramic member does not protrude from the second board surface of the multi-layer structure, the adhesive is adhered on the lateral surface of the ceramic member to connect the ceramic member and the plates; and a first conductive layer formed on the first board surface of the multi-layer structure and the first surface of the ceramic member.

Preferably, the ceramic member has a ceramic body and a first combining layer, one surface of the first combining layer is formed on the ceramic body, the other surface of the first combining surface is defined as the first surface of the ceramic member, the first combining layer is connected to the ceramic body and the first conductive layer by chemical bonding; the adhesive has a first end surface adhered on the first conductive layer, the first end surface is approximately coplanar with the first surface of the ceramic member.

Preferably, the thru-hole has a first part and a second part in air communication with the first part, a diameter of the first part is greater than that of the second part, the first part is concavely formed on the first board surface of the multi-layer structure, the second part is concavely formed on the second board surface of the multi-layer structure, the ceramic member is arranged in the first part of the multi-layer structure; the adhesive is adhered on the lateral surface and a portion of the second surface of the ceramic member, so the ceramic member and the plates are combined with each other by using the adhesive.

In summary, the ratio of the ceramic material of the circuit board of the instant disclosure is lower than that of the conventional ceramic circuit board, and the circuit board of the instant disclosure can be applied to a high-heat-generating product.

In order to further appreciate the characteristics and technical contents of the instant invention, references are hereunder made to the detailed descriptions and appended drawings in connection with the instant invention. However, the appended drawings are merely shown for exemplary purposes, rather than being used to restrict the scope of the instant invention.

DETAILED DESCRIPTION OF THE PREFERRED EMBODIMENTS

First Embodiment

Figure 1:
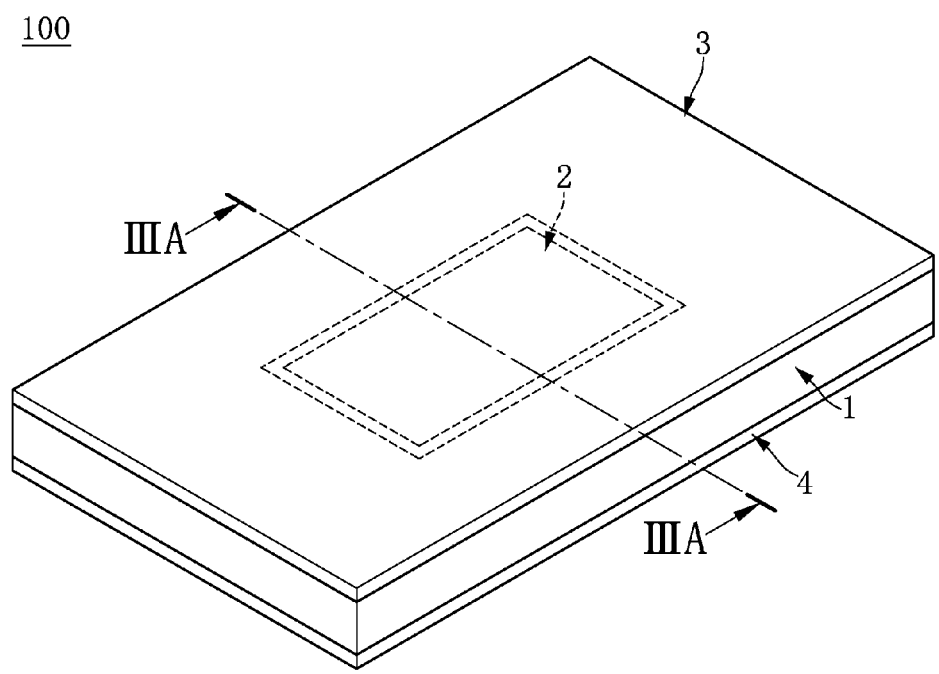
FIG. 1 is a perspective view showing a circuit board according to a first embodiment of the instant disclosure.
Figure 2:
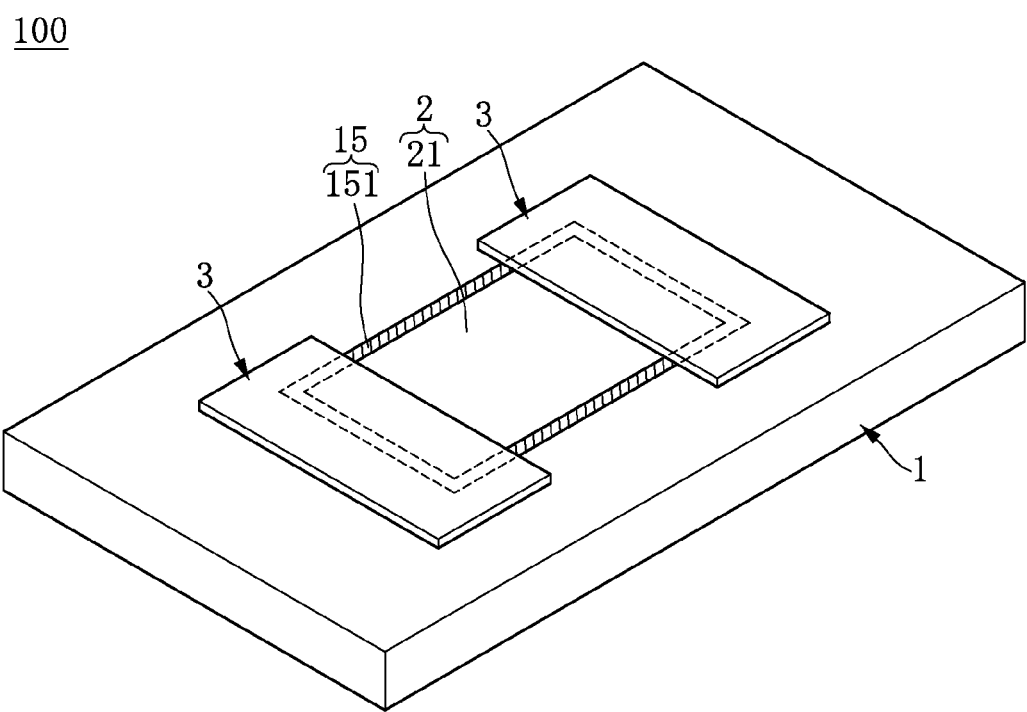
FIG. 2 is a perspective view of FIG. 1 from another perspective.

Please refer to FIGS. 1 through 3B, which show a first embodiment of the instant disclosure. References are hereunder made to the detailed descriptions and appended drawings in connection with the instant invention. However, the appended drawings are merely shown for exemplary purposes, rather than being used to restrict the scope of the instant invention.

Please refer to FIGS. 1 through 3A. The instant embodiment provides a circuit board 100 comprising a multi-layer structure 1, a ceramic member 2 embedded in the multi-layer structure 1, a first conductive layer 3, and a second conductive layer 4. The first conductive layer 3 is disposed on one surface (i.e., top surface) of the multi-layer structure 1 and the ceramic member 2, and the second conductive layer 4 is disposed on the other surface (i.e., bottom surface) of the multi-layer structure 1 and the ceramic member 2.

The multi-layer structure 1 in the instant embodiment is a FR-4 laminating board, the amount of the ceramic member 2 in the instant embodiment is one, but the instant disclosure is not limited to the instant embodiment. The following description discloses the constructions of the multi-layer structure 1 and the ceramic member 2, and then discloses the relationship of the multi-layer structure 1 and the ceramic member 2.

Figure 3A:
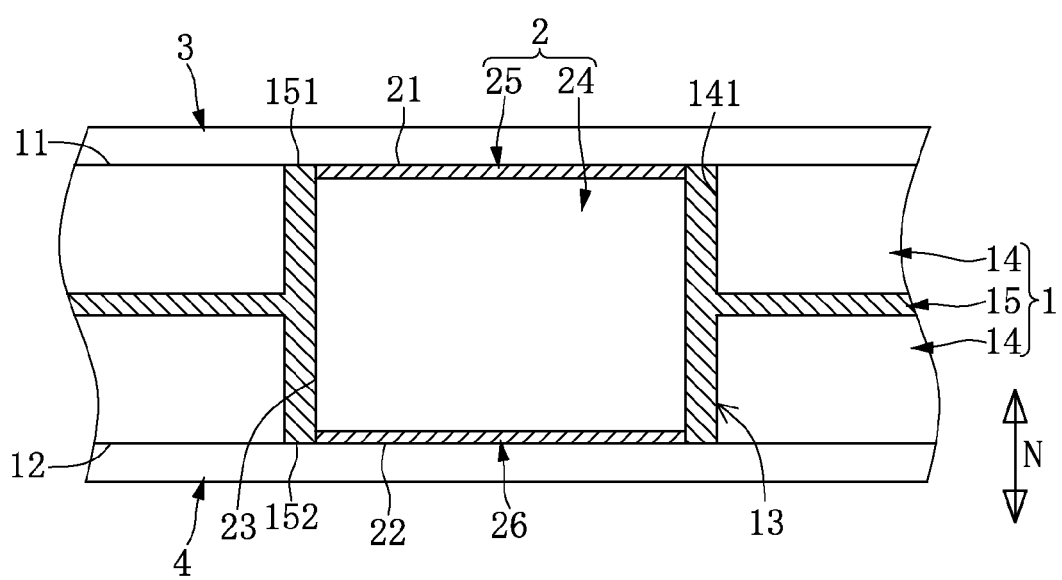
FIG. 3A is a cross-sectional view of FIG. 1 along a cross-sectional line IIIA- IIIA.

For clear explanation, when the multi-layer structure 1 is regarded as one piece, the multi-layer structure 1 has a first board surface 11 (i.e., the top board surface of the multi-layer structure 1 shown in FIG. 3A) and an opposite second board surface 12 (i.e., the bottom board surface of the multi-layer structure 1 shown in FIG. 3A), and the multi-layer structure 1 has a thru-hole 13, which is formed by penetrating from the first board surface 11 to the second board surface 12 along a direction perpendicular to the first board surface 11 (i.e., the normal direction of the first board surface 11).

In other words, the multi-layer structure 1 in the instant embodiment has a plurality of stacked plates 14 and an adhesive 15 connecting any two stacked plates 14. The stacked plates 14 are combined by using the adhesive 15, and the plates 14 are stacked along a stacking direction N (e.g., the normal direction of the first board surface 11).

Moreover, at least one of the plates 14 of the multi-layer structure 1 has a conductive circuit (not shown) for transmitting a signal. The multi-layer structure 1 in the instant embodiment has two plates 14, but the amount of the plates 14 of the multi-layer structure 1 can be greater than two, the instant disclosure is not limited to the instant embodiment.

Each of the plates 14 is formed by a preimpregnated material, and the preimpregnated material can be glass fiber prepreg, carbon fiber prepreg, or epoxy resin. Moreover, each plate 14 can be a soft plate. For example, each plate 14 can be formed by polyester (PET) or polyimide (PI) and does not have any glass fiber and any carbon fiber. However, the plate 14 of the instant disclosure is not limited to the above conditions.

Specifically, each plate 14 has an inner wall 141, and the inner walls 141 of the plates 14 define the thru-hole for receiving the ceramic member 2. That is to say, the inner walls 141 of the plates 14 are conforming in shape to the ceramic member 2. The inner wall 141 of each plate 14 can be formed before the lamination process of the multi-layer structure 1. The inner wall 141 of each plate 14 can be formed by using a non-chemical etching manner (e.g., laser drilling, plasma etching, or milling). For example, a laser drilling manner can be used to ablate the plate 14 along the stacking direction N to form the inner wall 141; or the inner wall 141 of the plate 14 can be formed by milling the plate 14 along the stacking direction N.

For clear explanation, when the ceramic member 2 is regarded as one piece, the ceramic member 2 has a first surface 21 (i.e., the top surface of the ceramic member 2 shown in FIG. 3A), an opposite second surface 22 (i.e., the bottom surface of the ceramic member 2 shown in FIG. 3A), and a lateral surface 23 connecting the edges of the first and second surfaces 21, 22. The ceramic member 2 is received in the thru-hole 13 of the multi-layer structure 1. The ceramic member 2 in the instant embodiment is embedded in the approximate center portion of the multi-layer structure 1, but is not limited thereto. Additionally, the ceramic member 2 in a non-shown embodiment can be a ceramic circuit board.

Moreover, the first surface 21 of the ceramic member 2 is approximately coplanar with the first board surface 11 of the multi-layer structure 1. The area of the first board surface 11 of the multi-layer structure 1 is at least two times of the area of the first surface 21 of the ceramic member 2, and the area of the first board surface 11 of the multi-layer structure 1 in the instant embodiment is two times of the area of the first surface 21 of the ceramic member 2. The second surface 22 of the ceramic member 2 is approximately coplanar with the second board surface 12 of the multi-layer structure 1. The area of the second board surface 12 of the multi-layer structure 1 is at least two times of the area of the second surface 22 of the ceramic member 2, and the area of the second board surface 12 of the multi-layer structure 1 in the instant embodiment is two times of the area of the second surface 22 of the ceramic member 2. Accordingly, the ratio of the ceramic material of the circuit board 100 of the instant disclosure is lower than that of the conventional ceramic circuit board.

Additionally, the adhesive 15 is adhered on the lateral surface 23 of the ceramic member 2 and the inner walls 141 of the plates 14, so the plates 14 are combined with each other by using the adhesive 15. The adhesive 15 has a first end surface 151 and a second end surface 152. The first end surface 151 is arranged between the first board surface 11 of the multi-layer structure 1 and the first surface 21 of the ceramic member 2, and the second end surface 152 is arranged between the second board surface 12 of the multi-layer structure 1 and the second surface 22 of the ceramic member 2. The first end surface 151 of the adhesive 15 is approximately coplanar with the first surface 21 of the ceramic member 2, and the second end surface 152 of the adhesive 15 is approximately coplanar with the second surface 22 of the ceramic member 2.

Specifically, the ceramic member 2 has a ceramic body 24, a first combining layer 25, and a second combining layer 26. The first combining layer 25 and the second combining layer 26 are respectively formed on two opposite surfaces of the ceramic body 24 (i.e., the top and bottom surface of the ceramic body 24 shown in FIG. 3A), the outer surface of the first combining layer 25 is defined as the first surface 21, and the outer surface of the second combining layer 26 is defined as the second surface 22. The ceramic body 24 in the instant embodiment is an aluminum nitride block. The first and second combining layers 25, 26 in the instant embodiment are titanium coating layers, and the first combining layer 25 and the second combining layer 26 are respectively formed on the two opposite surfaces of the ceramic body 24 by chemical bonding. The lateral surface 23 of the ceramic member 2 is regarded as a lateral surface of the ceramic body 24.

As shown in FIG. 3A, the first conductive layer 3 is formed on the first board surface 11 of the multi-layer structure 1 and the first surface 21 of the ceramic member 2, and the second conductive layer 4 is formed on the second board surface 12 of the multi-layer structure 1 and the second surface 22 of the ceramic member 2. The first bonding layer 25 of the ceramic member 2 is connected to the first conductive layer 3 by chemical bonding, and the second bonding layer 26 of the ceramic member 2 is connected to the second conductive layer 4 by chemical bonding, thus the first and second conductive layers 3, 4 can be firmly connected to the ceramic member 2 by using the first and second combining layers 25, 26. The first end surface 151 of the adhesive 15 is adhered on the first conductive layer 3, and the second end surface 152 of the adhesive 15 is adhered on the second conductive layer 4.

Figure 3B:
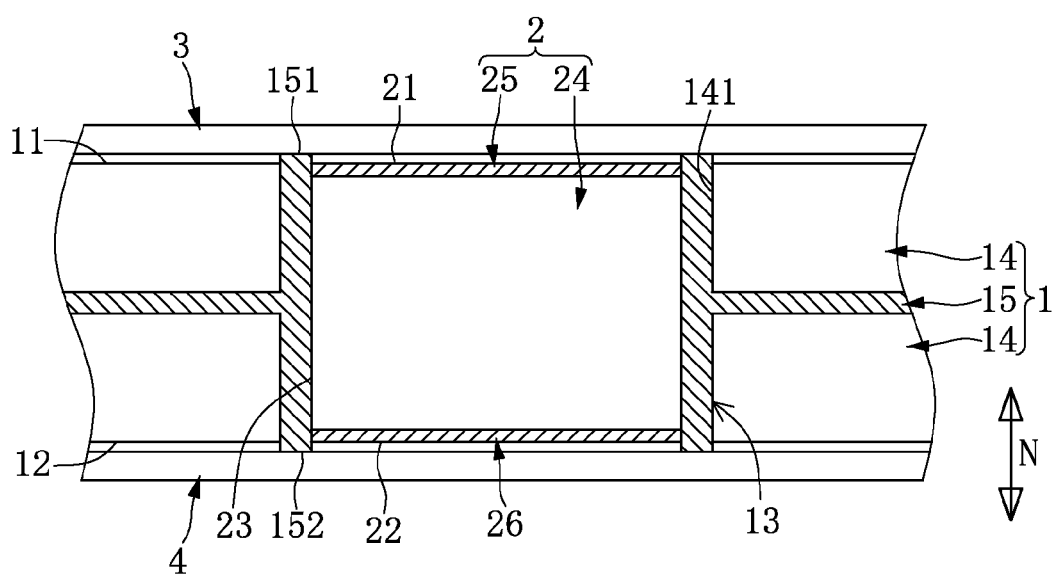
FIG. 3B is a cross-sectional view showing a different construction of the circuit board of the first embodiment.

Moreover, as shown in FIG. 3B, the first conductive layer 3 can be two stacked layers, one of the two layers has two portions, which are separated by the adhesive 15 and are respectively formed on the first board surface 11 of the multi-layer structure 1 and the first surface 21 of the ceramic member 2, and the other one of the two layers is formed on the two portions and the first end surface 151 of the adhesive 15. The second conductive layer 4 can be two stacked layers, one of the two layers has two portions, which are separated by the adhesive 15 and are respectively formed on the second board surface 12 of the multi-layer structure 1 and the second surface 22 of the ceramic member 2, and the other one of the two layers is formed on the two portions and the second end surface 152 of the adhesive 15.

Additionally, the first and second layers 3, 4 in the instant embodiment are formed by copper, and the construction of each of the first and second layers 3, 4 can be formed with a circuit pattern according to a designer's demand. The first and second layers 3, 4 are not limited to the instant embodiment.

Second Embodiment

Figure 4A:
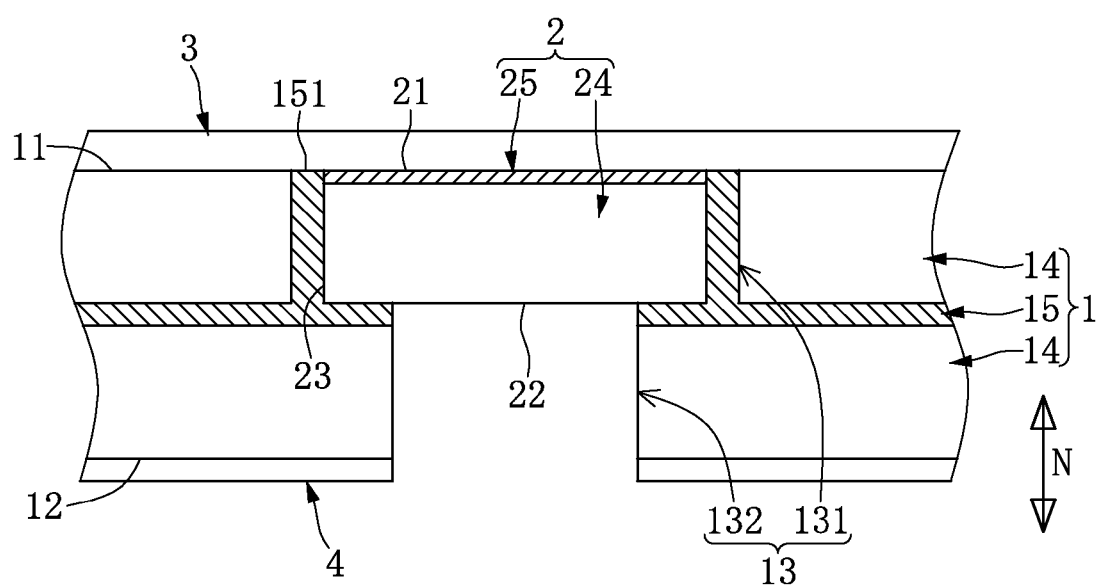
FIG. 4A is a cross-sectional view showing the circuit board according to a second embodiment of the instant disclosure.
Figure 4B:
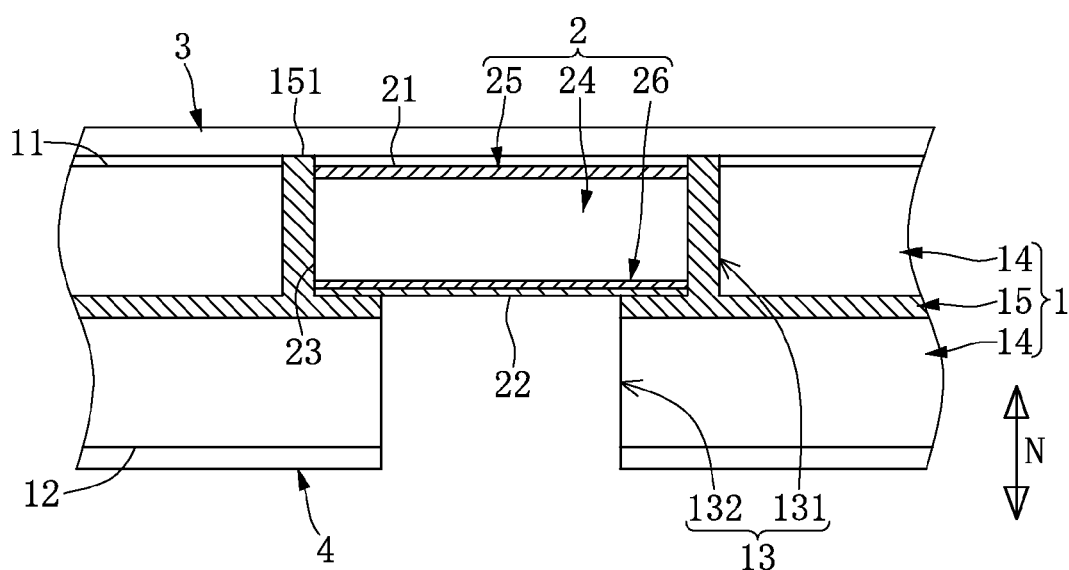
FIG. 4B is a cross-sectional view showing a different construction of the circuit board of the second embodiment.
Figure 5A:
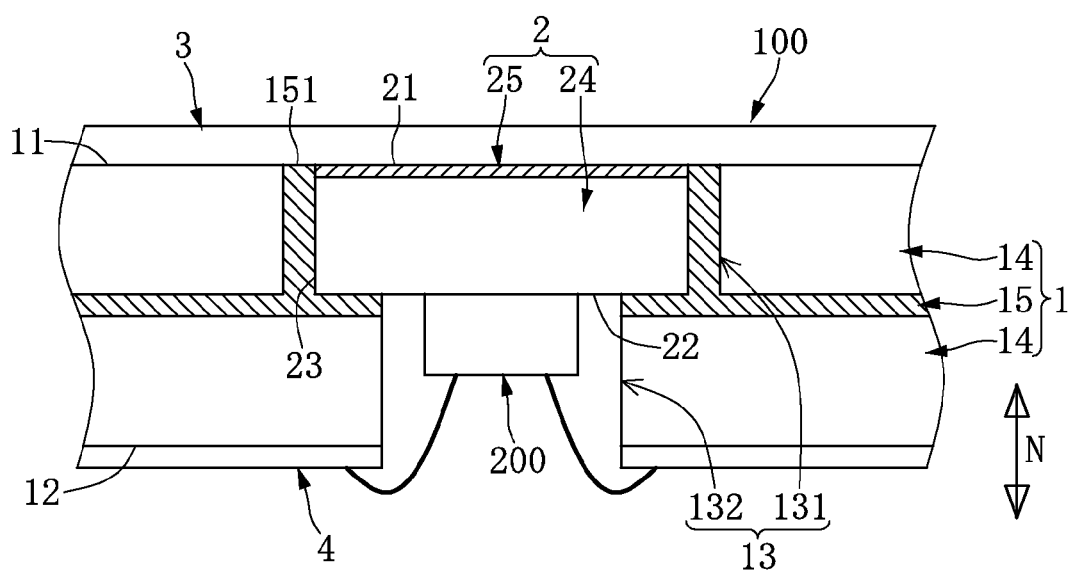
FIG. 5A is a cross-sectional view showing an electronic component installed on the circuit board of FIG. 4A.
Figure 5B:
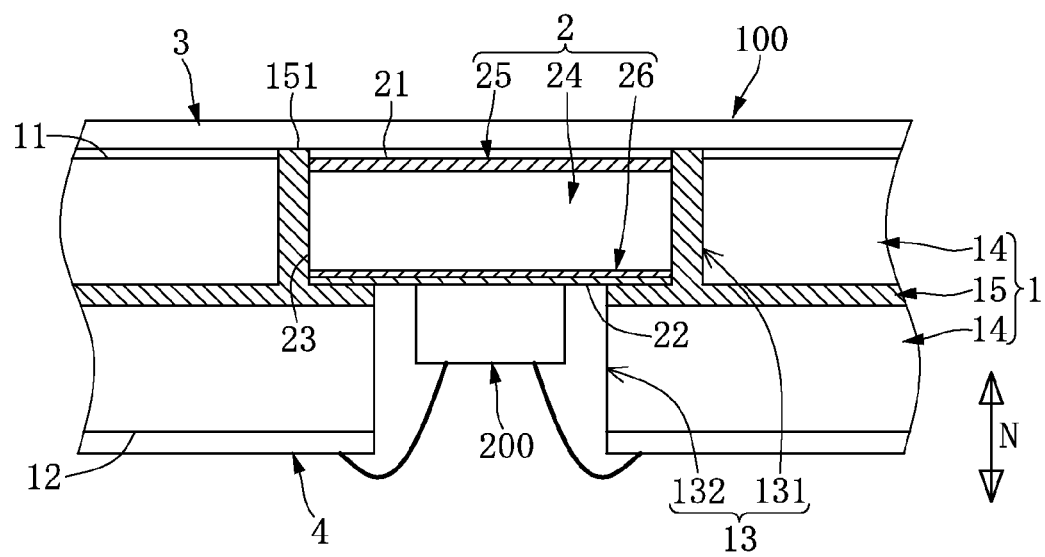
FIG. 5B is a cross-sectional view showing an electronic component installed on a different mode of the circuit board of FIG. 4B.

Please refer to FIGS. 4A through 5B, which show a second embodiment of the instant disclosure. The instant embodiment is similar to the first embodiment, and the difference between the two embodiments is disclosed as follows. The ceramic member 2 can be provided with or without the second combining layer 26, that is to say, the second surface 22 of the ceramic member 2 is selectively arranged on the second combining layer 26. When the ceramic member 2 is provided with the second combining layer 26 (as shown in FIGS. 4B and 5B), the second combining layer 26 includes a titanium coating layer and a copper layer stacked on the titanium coating layer; the second surface 22 of the ceramic member 2 is arranged inside the multi-layer structure 1, and the second surface 22 of the ceramic member 2 is not coplanar with the second board surface 12 of the multi-layer structure 1.

Specifically, the thru-hole 13 of the multi-layer structure 1 in the instant embodiment has a first part 131 and a second part 132 in air communication with the first part 131, and the diameter of the first part 131 is greater than that of the second part 132. The first part 131 is concavely formed on the first board surface 11 of the multi-layer structure 1, the second part 132 is concavely formed on the second board surface 12 of the multi-layer structure 1, and the second conductive layer 4 has an opening (not labeled) corresponding in position to the second part 132.

Moreover, the ceramic member 2 is arranged in the first part 131 of the thru-hole 13 of the multi-layer structure 1, and the adhesive 15 is adhered on the lateral surface 23 and a portion of the second surface 22 (i.e., the peripheral portion of the second surface 22 shown in FIGS. 4A and 4B) of the ceramic member 2, so the ceramic member 2 and the plates 14 are combined with each other by using the adhesive 15. The other portion of the second surface 22 of the ceramic member 2 (i.e., the center portion of the second surface 22 shown in FIGS. 4A and 4B), which is not adhered with the adhesive 15, is exposed from the multi-layer structure 1 via the second part 132 of the thru-hole 13 and the corresponding opening of the second conductive layer 4 for providing installation of an electronic component 200 (as shown in FIGS. 4A and 4B).

Specifically, a thermal expansion coefficient of the ceramic member 2 is lower than that of the multi-layer structure 1, and the thermal expansion coefficient of the ceramic member 2 is close to that of the electronic component 200, so the electronic component 200 disposed on the ceramic member 2 is better-suited than the electronic component 200 disposed on the multi-layer structure 1.

Third Embodiment

Figure 6:
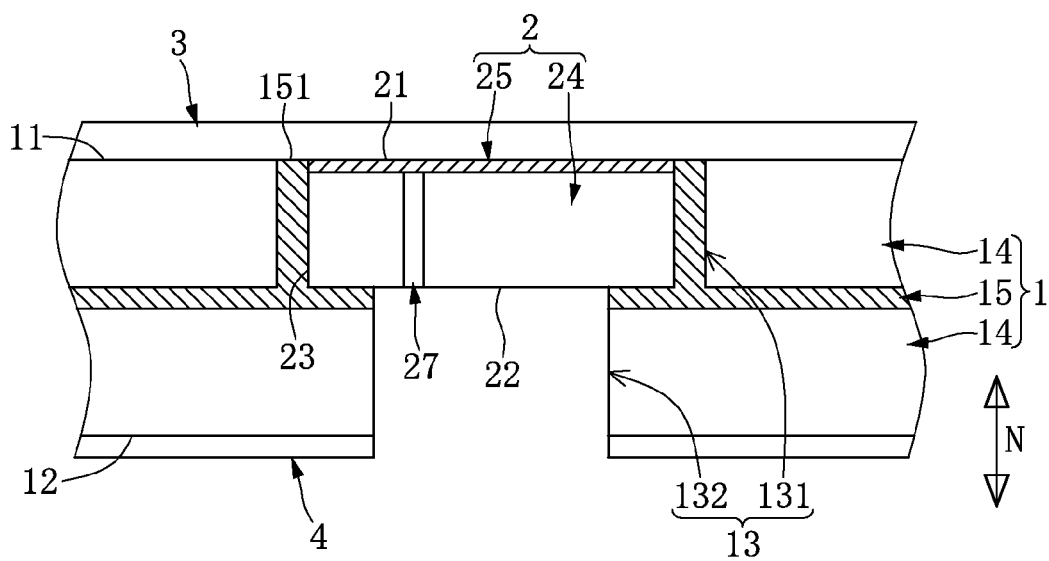
FIG. 6 is a cross-sectional view showing the circuit board according to a third embodiment of the instant disclosure.

Please refer to FIG. 6, which shows a third embodiment of the instant disclosure. The instant embodiment is similar to the second embodiment, and the difference between the two embodiments is disclosed as follows. The ceramic member 2 of the instant embodiment is a ceramic circuit board.

Specifically, the ceramic member 2 in the instant embodiment has a conductive circuit 27 arranged in the ceramic body 24. The conductive circuit 27 is electrically connected to the first conductive layer 3, and part of the conductive circuit 27 is exposed from the multi-layer structure 1 via the second part 132 of the thru-hole 13 and the corresponding opening of the second conductive layer 4 for electrically connecting to an electronic component, which is mounted on the second surface 22 (not shown). Additionally, a conductive layer (not shown) can be formed on the second surface 22 of the ceramic member 2 (i.e., the bottom surface of the ceramic body 24 shown in FIG. 6) according to a designer's demand, but the instant disclosure is not limited thereto.

The Possible Effect of the Instant Disclosure

In summary, the ratio of the ceramic material of the circuit board of the instant disclosure is lower than that of the conventional ceramic circuit board, and the circuit board of the instant disclosure can be applied to a high-heat-generating product.

Moreover, the thermal expansion coefficient of the ceramic member is lower than that of the multi-layer structure, and the thermal expansion coefficient of the ceramic member is close to that of the electronic component, so the electronic component disposed on the ceramic member is better-suited than the electronic component disposed on the multi-layer structure.

The descriptions illustrated supra set forth simply the preferred embodiments of the instant invention; however, the characteristics of the instant invention are by no means restricted thereto. All changes, alterations, or modifications conveniently considered by those skilled in the art are deemed to be encompassed within the scope of the instant invention delineated by the following claims.

What is claimed is:

1. A circuit board, comprising:
a multi-layer structure having a first board surface and an opposite second board surface, the multi-layer structure having a thru-hole penetrating the first board surface and the second board surface, wherein the multi-layer structure has a plurality of stacked plates and an adhesive connecting any two stacked plates;
a ceramic member having a first surface, an opposite second surface, and a lateral surface connecting an edge of the first surface and an edge of the second surface, wherein the ceramic member is arranged in the thru-hole of the multi-layer structure, the first surface of the ceramic member is approximately coplanar with the first board surface of the multi-layer structure, the second surface of the ceramic member does not protrude from the second board surface of the multi-layer structure, the adhesive is adhered on the lateral surface of the ceramic member to connect the ceramic member and the plates;
a first conductive layer formed on the first board surface of the multi-layer structure and the first surface of the ceramic member.

2. The circuit board as claimed in claim 1, wherein the ceramic member has a ceramic body and a first combining layer, one surface of the first combining layer is formed on the ceramic body, the other surface of the first combining surface is defined as the first surface of the ceramic member, the first combining layer is connected to the ceramic body and the first conductive layer by chemical bonding.

3. The circuit board as claimed in claim 2, wherein the adhesive has a first end surface adhered on the first conductive layer, the first end surface is approximately coplanar with the first surface of the ceramic member.

4. The circuit board as claimed in claim 3, wherein the ceramic member is embedded in the multi-layer structure, and an area of the first board surface of the multi-layer structure is at least two times of an area of the first surface of the ceramic member.

5. The circuit board as claimed in claim 3, wherein the second surface of the ceramic member is approximately coplanar with the second board surface of the multi-layer structure, the circuit board has a second conductive layer formed on the second board surface of the multi-layer structure and the second surface of the ceramic member; the ceramic member has a second combining layer, one surface of the second combining layer is formed on the ceramic body, the other surface of the second combining surface is defined as the second surface of the ceramic member, the second combining layer is connected to the ceramic body and the second conductive layer by chemical bonding.

6. The circuit board as claimed in claim 5, wherein the adhesive has a second end surface adhered on the second conductive layer, the second end surface is approximately coplanar with the second surface of the ceramic member.

7. The circuit board as claimed in claim 3, wherein the thru-hole has a first part and a second part in air communication with the first part, a diameter of the first part is greater than that of the second part, the first part is concavely formed on the first board surface of the multi-layer structure, the second part is concavely formed on the second board surface of the multi-layer structure, the ceramic member is arranged in the first part of the multi-layer structure; the adhesive is adhered on the lateral surface and a portion of the second surface of the ceramic member, so the ceramic member and the plates are combined with each other by using the adhesive.

8. The circuit board as claimed in claim 7, wherein a portion of the second surface of the ceramic member not adhered with the adhesive is exposed from the multi-layer structure via the second part of the thru-hole for providing installation of an electronic component, and a thermal expansion coefficient of the ceramic member is close to that of the electronic component.

9. The circuit board as claimed in claim 8, wherein the ceramic member has a conductive circuit arranged in the ceramic body, the conductive circuit is electrically connected to the first conductive layer, and part of the conductive circuit is exposed from the multi-layer structure via the second part of the thru-hole for electrically connecting to the electronic component.

10. The circuit board as claimed in claim 2, wherein the ceramic body is an aluminum nitride block, the first combining layer is a titanium coating layer.

\* \* \* \* \*